Sept. 22, 1964 R. B. SCHRECONGOST 3,150,328

TRANSISTOR OSCILLATOR HAVING TWO REGENERATIVE FEEDBACK PATHS

Filed Oct. 24, 1960

INVENTOR.
Ray B. Schrecongost
BY Wupper, Gradolph + Love,
Attys.

3,150,328

TRANSISTOR OSCILLATOR HAVING TWO REGENERATIVE FEEDBACK PATHS

Ray B. Schrecongost, Park Ridge, Ill., assignor to Hammond Organ Company, Chicago, Ill., a corporation of Delaware Filed Oct. 24, 1960, Ser. No. 64,536
6 Claims. (Cl. 331—109)

This invention relates to improvements in transistor oscillator circuits for use in electrical musical instruments such as organs.

In the electric organ art, it is frequently desirable to provide tone signal generating apparatus which produces sine wave signals substantially free of distortion and which exhibits frequency stability of the highest order. For this reason, tone generating equipment, until very recently, has been characterized to a great extent by electromagnetic tone generators and circuits for selectively controlling the application of the generated tones to a speaker or speakers. In recent years, there has been a trend toward introducing electronic oscillators to replace the electromagnetic tone signal generators; and more especially there has been a desire to provide transistor oscillators for compactness, longer life and greater resistance to shock. However, serious frequency stability problems have been encountered in transistor oscillator circuits and progress in the correction of these problems without prohibitive additional cost has been slow.

It is therefore a primary object of the present invention to provide an improved transistor oscillator exhibiting improved frequency stability under conditions of limited supply voltage variation and of widely varying ambient temperatures. This has been accomplished in the preferred embodiment by the provision of suitably controlled feedback paths to both the transistor base and transistor emitter in such manner that the frequency of the oscillator output is, within limits, substantially independent of voltage and ambient temperature changes.

Another object of the invention is the provision of an improved transistor oscillator in which the degree of frequency stability under conditions of varying supply voltage is adjustable.

Figure 1:
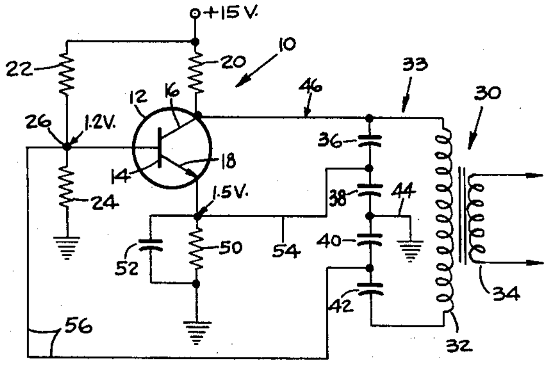
Figure 2:
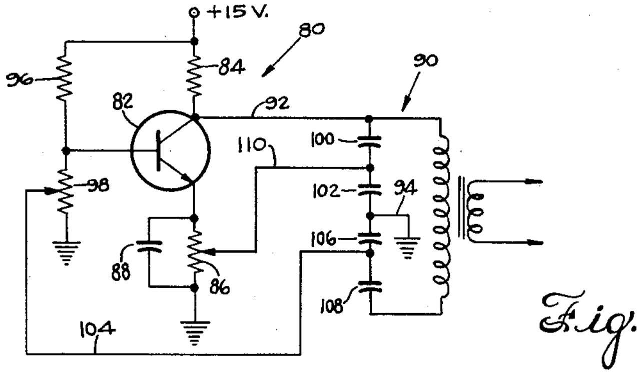
Figure 3:
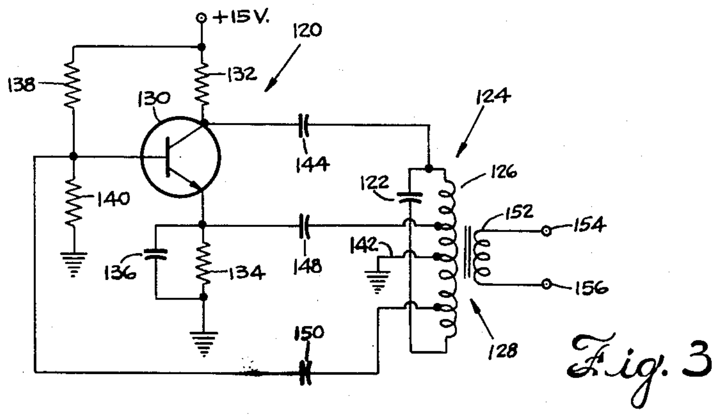

Other objects and the various features of the invention will be evident upon a perusal of the following description taken in conjunction with the accompanying drawings, in which:

FIGS. 1, 2, and 3 show three embodiments of applicant's improved transistor oscillator circuit.

Each of the three embodiments of FIGS. 1, 2, and 3 is shown using NPN transistors. However, it will be appreciated that the same circuits may be utilized in conjunction with PNP transistors so long as the proper battery connections are made. The oscillator 10 of FIG. 1 comprises a transistor 12 having a base 14, a collector 16, and an emitter 18. A positive 15-volt potential is connected to the collector by way of the resistor 20. A resistor network comprising resistors 22 and 24 are connected between ground and positive potential, and the base is connected to the junction 26 between the two resistors to provide a positive bias potential for the base.

The output of the oscillator comprises a transformer 30 having a primary coil 32 and secondary coil 34. The primary coil and series connected capacitors 36, 38, 40 and 42 form a tank circuit which is resonant at a desired frequency determined by the inductance of the primary and the capacitance of the capacitors 36–42. The tank circuit is connected between ground and the collector of the transistor by means of conductors 44 and 46.

The emitter 18 is connected to ground by way of an emitter resistor 50 and a partial by-pass capacitor, which includes capacitors 38 and 52 in parallel, so chosen as to by-pass only an appropriate portion of the signal, the remaining portion being applied to the emitter 18. Feedback between the tank circuit and the emitter is provided by means of a conductor 54 connected between capacitors 36 and 38, which provide a desired voltage drop at the oscillator frequency, and feedback between the tank circuit and the base is provided by way of conductor 56 connected between capacitors 40 and 42 which also provide a voltage drop at the oscillator frequency.

It has been found that the use of the two complementing feedback paths to both the base and emitter provides excellent frequency stability substantially independent of normal variations in supply voltage and ambient temperature. The tendency of the circuit to introduce frequency changes in response to voltage and temperature changes for each of the individual feedback circuits with the values shown appears substantially to cancel each other to provide unusually good frequency stability.

The amount of feedback in each path may be increased to predominate over that in the other path in the event that a slight variation in frequency—either increasing or decreasing—is desired. Thus the oscillator 80 of FIG. 2 is generally similar to oscillator 10 of FIG. 1 except that the amount of base and emitter feedback is adjustable in the former. The oscillator 80 includes a transistor 82. The collector of the transistor is connected to positive battery potential by way of the resistor 84 and the emitter is connected to ground potential by way of a potentiometer 86 and a partial by-pass capacitor 88. A tank circuit 90 similar to tank circuit 33 of FIG. 1 is connected between the collector and ground by way of conductors 92 and 94. A positive bias potential is provided for the transistor base by means of a resistor 96 and a potentiometer 98 which are connected between ground and the positive battery terminal.

The transistor emitter feedback path extends from the junction between capacitors 100 and 102 of the tank circuit to the potentiometer 86 by way of a conductor 110. The amount of feedback to the emitter may be increased or decreased by decreasing or increasing that portion of the resistance of the potentiometer 86 connected between the emitter and the adjustable contact on the potentiometer.

The base feedback path extends from the junction between capacitors 106 and 108 to the potentiometer 98 by way of conductor 104. The amount of feedback to the base may be controlled by positioning the adjustable arm of the potentiometer 98. Too much feedback into the base has been found to result in a positive voltage-frequency characteristic, too much feedback into the emitter has been found to cause a negative voltage-frequency characteristic, and the proper amount of feedback has been found to result in a zero voltage-frequency characteristic and improved general oscillator stability.

The oscillator 120 of FIG. 3 is generally similar to the oscillators 10 and 80 of FIGS. 1 and 2 except that only one capacitor is provided in the tank circuit 124, and the primary coil 126 of the transformer 128 must be provided with tapped connections. The collector of transistor 130 is connected to positive battery potential by means of resistor 132. The emitter is connected to ground by way of resistor 134 and by-pass capacitor 136. A positive bias potential is provided for the base of the transistor by means of resistors 138 and 140 which are connected in series across the terminals of the battery or power supply. The tank circuit 124 is connected to ground by a conductor 142 and to the collector by way of an isolating capacitor 144.

Feedback to the emitter is provided from one of the taps on the primary winding 126 by an isolating capacitor 148. Feedback to the base of the transistor is provided by way of an isolating capacitor 150 which is connected to another tap of the primary winding 126. A secondary winding 152 of the transformer 124 applies an output signal across terminals 154 and 156.

In each embodiment, oscillations are initiated by transient noise and are sustained by the regenerative feedback in a well known manner to produce an output signal at a frequency determined by the resonant frequency of the tank circuit.

While I have shown and described the preferred embodiments of my invention, it will be apparent that numerous variations and modifications thereof may be made without departing from the underlying principles of the invention. I therefore desire, by the following claims, to include within the scope of the invention, all such variations and modifications by which substantially the results of my invention may be obtained through the use of substantially the same or equivalent means.

I claim:

1. In an electronic musical instrument, a transistor oscillator substantially independent of changes in voltage and ambient temperature comprising a transistor having a base, a collector, and an emitter, a source of direct current potential having a pair of terminals, means including a resistor connecting the collector to one of the terminals, means including a second resistor and a partial by-pass capacitor connected in parallel with the second resistor connecting the emitter to the other terminal, a resonant tank circuit connected between the collector and said other terminal, means applying a small bias to the base, a first feedback path connected between the tank circuit and the emitter, and a second feedback path connected between the tank circuit and the base.

2. In an electronic musical instrument, a transistor oscillator substantially independent of changes in voltage and ambient temperature comprising a transistor having a base, a collector, and an emitter, a source of direct current potential having a pair of terminals, means including a resistor connecting the collector to one of the terminals, means including a second resistor and a partial by-pass capacitor connected in parallel with the second resistor connecting the emitter to thte other terminal, a resonant tank circuit having a coil with one end connected to the collector, a first capacitor connected between one end of the coil and said emitter, a second capacitor connected to the first capacitor and said emitter and to the other terminal, a third capacitor connected between the other end of the coil and said base, a fourth capacitor connected to the third capacitor between said third capacitor and said base and to the other terminal, and means applying a small bias to the base.

3. In an electronic musical instrument, a transistor oscillator substantially independent of changes in voltage and ambient temperature comprising a transistor having a base, a collector, and an emitter, a source of direct current potential having a pair of terminals, means including a resistor connecting the collector to one of the terminals, means including a second resistor and a partial by-pass capacitor connected in parallel with the second resistor connecting the emitter to the other terminal, a resonant tank circuit connected to said other terminal and capacitively coupled to the collector, means applying a small positive bias to the base, a first capacitive feedback path connected between the tank circuit and emitter, and a second capacitive feedback path connected between the tank circuit and the base.

4. In an electronic musical instrument, a transistor oscillator substantially independent of changes in voltage and ambient temperature comprising an NPN junction transistor having a base, a collector, and an emitter, a source of direct current potential having positive and negative terminals, means including a resistor connecting the collector to the positive terminal, means including a second resistor and a partial by-pass capacitor connected in parallel with the second resistor connecting the emitter to the negative terminal, a resonant tank circuit connected between the collector and the negative terminal, means applying a small positive bias to the base, a first feedback path connected between the tank circuit and the emitter, and a second feedback path connected between the tank circuit and the base.

5. In an electronic musical instrument, a transistor oscillator substantially independent of changes in voltage and ambient temperature comprising a transistor having a base, a collector, and an emitter, a source of direct current potential having a pair of terminals, means including a resistor connecting the collector to one of the terminals, means including a second resistor with end terminals and a sliding contact and a partial by-pass capacitor connected in parallel with the second resistor connecting the emitter to the other terminal, a resonant tank circuit connected between the collector and said other terminal, means applying a small positive bias to the base, a first feedback path connected between the tank circuit and the base, and a second feedback path connected between the tank circuit and the sliding contact to adjust the feedback to the emitter for a desired positive, negative or zero voltage-frequency characteristic.

6. In an electronic musical instrument, a transistor oscillator substantially independent of changes in voltage and ambient temperature comprising a transistor having a base, a collector, and an emitter, a source of direct current potential, circuits connecting the source to the collector, emitter and base for operating the transistor, means including a resistor and a partial bypass capacitor connected in parallel with the resistor in the emitter circuit, a resonant tank circuit in the collector circuit, a first feedback means connected between the tank circuit and the emitter, and a second feedback means connected between the tank circuit and the base, said feedback means being substantially 180° out of phase with respect to each other and both being applied to said transistor in a regenerative sense.

References Cited in the file of this patent

UNITED STATES PATENTS

| | | |
|---|---|---|
| 2,093,416 | Case | Feb. 15, 1936 |
| 2,225,897 | Bell | Dec. 24, 1940 |
| 2,841,711 | Koch | July 1, 1958 |